(12) United States Patent
Chow et al.

(10) Patent No.: US 8,507,319 B2
(45) Date of Patent: Aug. 13, 2013

(54) INTEGRATED CIRCUIT PACKAGE SYSTEM WITH SHIELD

(75) Inventors: Seng Guan Chow, Singapore (SG); Byung Tai Do, Singapore (SG); Heap Hoe Kuan, Singapore (SG); Rui Huang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 383 days.

(21) Appl. No.: 11/952,968

(22) Filed: Dec. 7, 2007

(65) Prior Publication Data

US 2009/0146269 A1   Jun. 11, 2009

(51) Int. Cl.
*H01L 21/60* (2006.01)

(52) U.S. Cl.
USPC ............ 438/112; 438/111; 257/659; 257/660; 257/676

(58) Field of Classification Search
USPC .......................... 257/659, 676, 660
See application file for complete search history.

(56) References Cited

U.S. PATENT DOCUMENTS

| | | | |
|---|---|---|---|
| 5,166,772 A | 11/1992 | Soldner et al. | |
| 5,223,739 A | 6/1993 | Katsumata et al. | |
| 5,294,826 A | 3/1994 | Marcantonio et al. | |
| 5,656,864 A | 8/1997 | Mitsue et al. | |
| 5,679,975 A * | 10/1997 | Wyland et al. | 257/659 |
| 5,703,398 A | 12/1997 | Sono et al. | |
| 6,092,281 A | 7/2000 | Glenn | |
| 6,312,975 B1 * | 11/2001 | Brechignac et al. | 438/112 |
| 6,603,193 B2 | 8/2003 | Crane, Jr. et al. | |
| 6,707,168 B1 | 3/2004 | Hoffman et al. | |
| 6,734,539 B2 | 5/2004 | Degani et al. | |
| 6,847,115 B2 | 1/2005 | Crane, Jr. et al. | |
| 7,187,060 B2 | 3/2007 | Usui | |
| 7,479,692 B2 | 1/2009 | Dimaano, Jr. et al. | |
| 7,582,951 B2 | 9/2009 | Zhao et al. | |
| 7,618,845 B2 * | 11/2009 | Lim | 438/112 |
| 7,626,247 B2 | 12/2009 | Lam | |
| 2008/0150104 A1 * | 6/2008 | Zimmerman et al. | 257/676 |
| 2008/0157302 A1 * | 7/2008 | Lee et al. | 257/676 |
| 2009/0146268 A1 | 6/2009 | Huang et al. | |

OTHER PUBLICATIONS

Definition of 'coplanar', "Merriam-Webster's Collegiate Dictionary", Tenth Edition, 1994, p. 256, Publisher: Merriam-Webster, Incorporated, Springfield, MA, USA.

* cited by examiner

*Primary Examiner* — Howard Weiss
*Assistant Examiner* — Tifney Skyles
(74) *Attorney, Agent, or Firm* — Ishimaru & Associates LLP; I-Chang John Yang

(57) ABSTRACT

An integrated circuit package system includes: forming a first lead and a second lead; connecting an integrated circuit die with the first lead; forming an encapsulation over the integrated circuit die, the first lead, and the second lead with a portion of a top side of the second lead exposed; and forming a shield over the encapsulation, the first lead, and the second lead with the shield not in contact with the first lead.

20 Claims, 4 Drawing Sheets

INTEGRATED CIRCUIT PACKAGE SYSTEM WITH SHIELD

CROSS-REFERENCE TO RELATED APPLICATION(S)

The present application contains subject matter related to concurrently filed U.S. patent application Ser. No. 11/952,951, now U.S. Pat. No. 7,902,644. The related application is assigned to STATS ChipPAC Ltd.

TECHNICAL FIELD

The present invention relates generally to an integrated circuit package system and more particularly to an integrated circuit package system with shield.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package. Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

In response to the demands for miniaturization, the distance between the semiconductor chips are decreased to achieve higher density thereof in order to mounting the high frequency LSI adjacent to other high frequency LSIs. This practice has led to problems of LSI being increasingly affected by noise, more specifically electromagnetic interference (EMI).

Conventionally, a technique for addressing the EMI problem is covering a package of a semiconductor device with a metal package structure. However this metal package structure generally has to be mounted on the printed circuit board as an independent component separated from the semiconductor device, and thus the size of package with the metal package structure increases, thereby prohibiting or limiting the miniaturization of the package. In addition, the metal package structure is formed as a component separated from the semiconductor device, thereby increasing manufacturing cost.

Numerous package approaches attempt to provide shields within the semiconductor packages. However, this requires custom structures taking into account the integrated circuit size, height, and any stacking configurations as well as other elements in the package, such as bond wires or other devices. Also, customization is required to attach the shields to the appropriate ground source. All these considerations, as well as others, increase the complexity of the manufacturing process, decreases yield, and increased cost.

Thus, a need still remains for an integrated circuit package system providing low cost manufacturing, improved yields, reduction of integrated circuit package dimensions, and solving the problems caused by noises. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: forming a first lead and a second lead; connecting an integrated circuit die with the first lead; forming an encapsulation over the integrated circuit die, the first lead, and the second lead with a portion of a top side of the second lead exposed; and forming a shield over the encapsulation, the first lead, and the second lead with the shield not in contact with the first lead.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
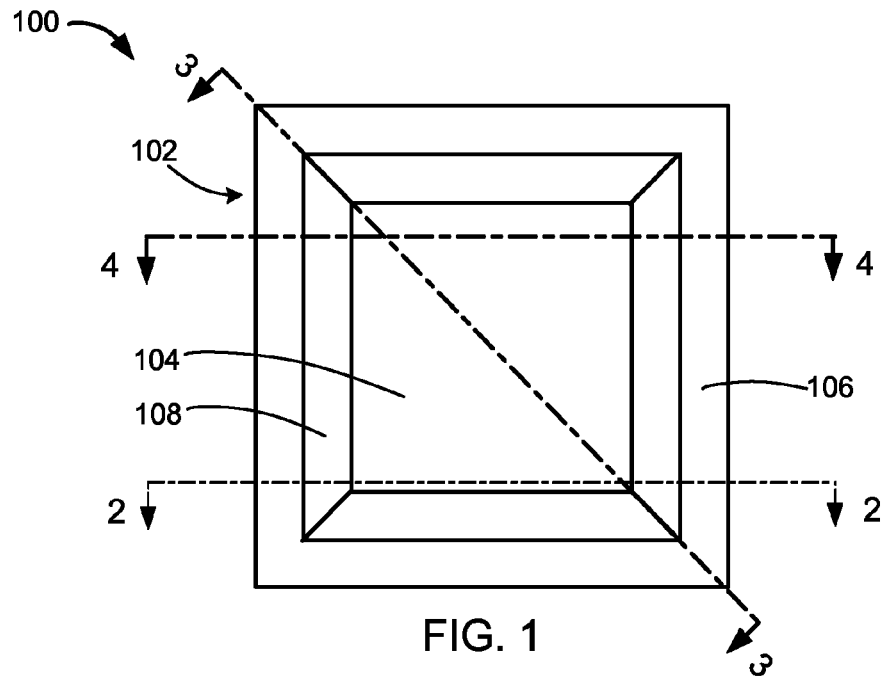
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts a shield 102 covering the integrated circuit package system 100. A central horizontal portion 104 of the shield 102 is higher than a perimeter horizontal portion 106 adjacent to the four edges of the integrated circuit package system 100. Between the central horizontal portion 104 and the perimeter horizontal portion 106 may be a non-horizontal portion 108.

Figure 2:
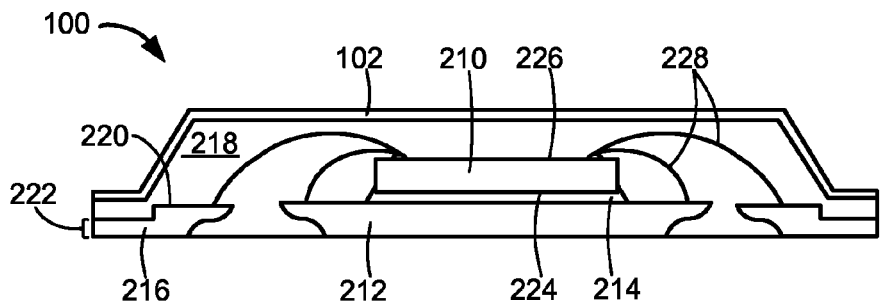
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts an integrated circuit die 210 mounted over a die-attach pad 212 with an adhesive 214, such as a die-attach adhesive, and a first lead 216. An encapsulation 218, such as an epoxy molding compound, covers the integrated circuit die 210 and the first lead 216. The shield 102 conformally covers a top surface of the encapsulation 218.

The shield 102 can be formed from a number of different conductive materials. For example, the shield 102 can be formed from metal, conductive resin, foil and conductive film. The shield 102 may connect to a ground reference or a reference at other voltage levels to provide electromagnetic interference (EMI) shielding for the integrated circuit package system 100.

A portion of the first lead 216 is half-etched from a top side 220 of the first lead 216 to form a stepped down portion 222 such that the encapsulation 218 can be between the stepped down portion 222 of the first lead 216 and the shield 102. The encapsulation 218 can prevent electrical shorting between the shield 102 and the first lead 216 because the step down portion 222 is shorter than a planar sidewall of the encapsulation 218. The encapsulation 218 is formed to be coplanar with the first lead 216 on a horizontal bottom includes a vertical end with the first lead 216 exposed from and coplanar with the planar sidewall of the encapsulation 218. The shield 102 can include an outer edge facing away from the integrated circuit die 210 and coplanar with the planar sidewall of the encapsulation 218.

The integrated circuit die 210 has a non-active side 224 and an active side 226, wherein the active side 226 includes active circuitry fabricated thereon. In this example, the non-active side 224 preferably faces the die-attach pad 212. The die-attach pad 212 is coplanar with the first lead 216. Internal interconnects 228, such as bond wires or ribbon bond wires, may connect between the active side 226 and the die-attach pad 212, and between the active side 226 and the first lead 216.

For illustrative purposes, both the first lead 216 and the die-attach pad 212 are shown connected to the same bond pad on the active side 226. Although, it is understood that the die-attach pad 212 and the first lead 216 may not connect to the same location on the active side 226. For example, the die-attach pad 212 may electrically connect to a ground reference and the first lead 216 may connect to a different bond pad on the integrated circuit die 210.

Figure 3:
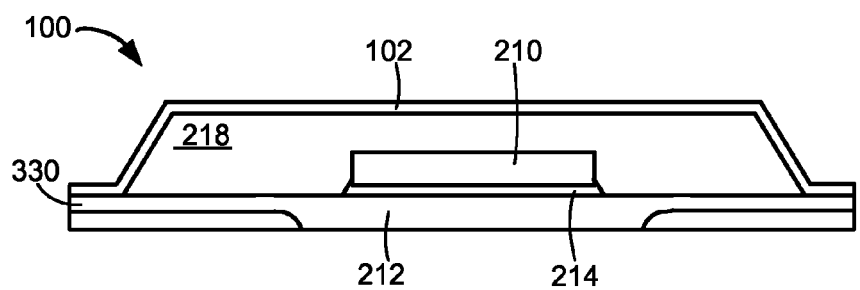
FIG. 3 is a cross-sectional view of the integrated circuit package system along line 3-3 of FIG. 1.

Referring now to FIG. 3, therein is shown a cross-sectional view of the integrated circuit package system 100 along line 3-3 of FIG. 1. The cross-sectional view depicts the integrated circuit die 210 mounted over the die-attach pad 212 with the adhesive 214 and over a corner lead 330. The encapsulation 218 is over the integrated circuit die 210 and the corner lead 330.

The corner lead 330 extends from the die-attach pad 212. A portion of the corner lead 330, at the opposite end of the die-attach pad 212, is preferably exposed from the encapsulation 218. The shield 102 is formed over the exposed end of the corner lead 330 and preferably electrically connects to the corner lead 330. In this example, the shield 102 may connect to a ground reference through the corner lead 330 and the die-attach pad 212 to provide EMI shielding for the integrated circuit package system 100.

Figure 4:
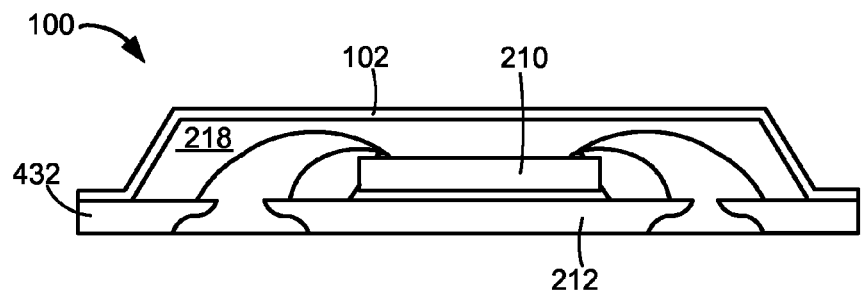
FIG. 4 is a cross-sectional view of the integrated circuit package system along line 4-4 of FIG. 1.

Referring now to FIG. 4, therein is shown a cross-sectional view of the integrated circuit package system 100 along line 4-4 of FIG. 1. The cross-sectional view depicts the integrated circuit die 210 mounted over the die-attach pad 212 and a second lead 432. The encapsulation 218 is over the integrated circuit die 210, the die-attach pad 212, and the second lead 432.

A top portion of the second lead 432 is preferably exposed from the encapsulation 218. The shield 102 is formed over the top portion of the second lead 432 and preferably electrically connects to the second lead 432. In this example, the shield 102 may connect to a ground reference or a reference at other voltage levels through the second lead 432 to provide EMI shielding for the integrated circuit package system 100. The shield 102 is directly on the top portion of the second lead 432. The outer edge of the shield 102 can be coplanar with an outer edge of the second lead 432 and the planar sidewall of the encapsulation 218.

It has also been discovered that in the present invention provides a flexible EMI structural and manufacturing while providing a low package height, low cost, and improved yield. Half-etching of the first leads allows isolation of the first leads from the conformal shield over the encapsulation. This allows the first leads to be used for other functions, such as signal leads, and not constrained to provide reference for the shield. The corner leads, the second leads, or a combination thereof may provide the ground connection for the shield providing the EMI function.

Figure 5:
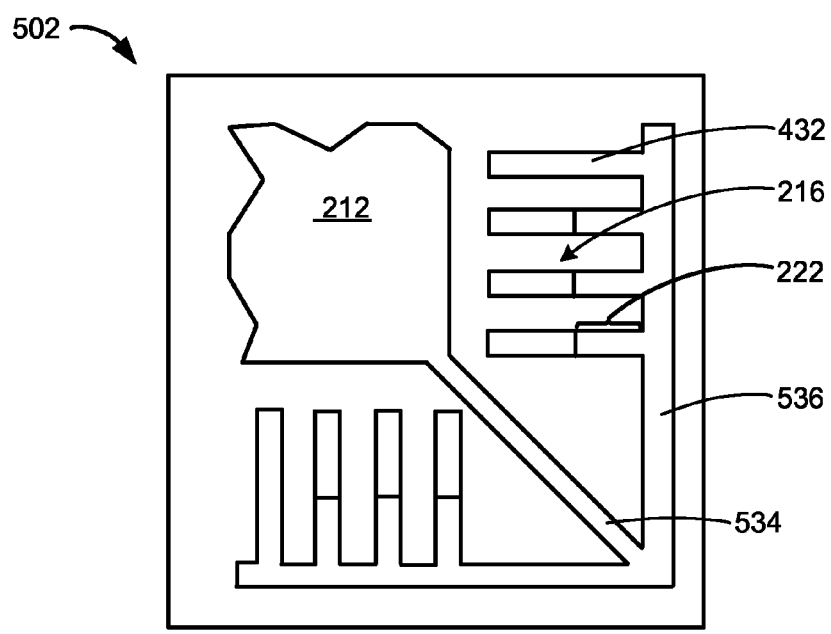
FIG. 5 is a top view of a portion of a lead frame for forming the integrated circuit package system of FIG. 1.

Referring now to FIG. 5, therein is shown a top view of a portion of a lead frame 502 for forming the integrated circuit package system 100 of FIG. 1. The plan view depicts the die-attach pad 212, a tie bar 534, a dam bar 536 the first lead 216, and the second lead 432. The first lead 216 and the second lead 432 extends from the dam bar 536. The first lead 216 include the lower portion 222 adjacent to the dam bar 536. The lower portion 222 may be half-etched from the top side 220 of FIG. 2 of the first lead 216.

The tie bar 534 connects between the dam bar 536 and the die-attach pad 212. The dam bar 536 supports the leads during the manufacturing process of the integrated circuit package system 100. The dam bar 536 is removed with the manufacturing process, such as a singulation process. Removal of the dam bar 536 may form the corner lead 330 from the tie bar 534.

Figure 6:
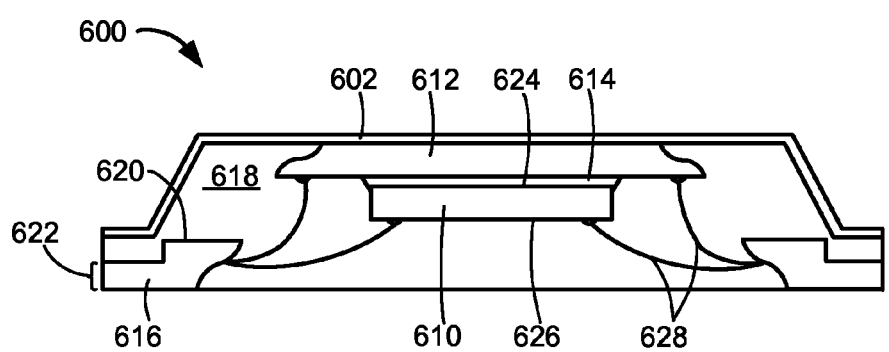
FIG. 6 is a cross-sectional view of an integrated circuit package system exemplified by the top view of FIG. 1 along line 2-2 of FIG. 1 in a second embodiment of the present invention.

Referring now to FIG. 6, therein is shown a cross-sectional view of an integrated circuit package system 600 exemplified by the top view of FIG. 1 along line 2-2 of FIG. 1 in a second embodiment of the present invention. The cross-sectional view depicts a shield 602 over a die-attach pad 612 and an encapsulation 618. The cross-sectional view also depicts an integrated circuit die 610 mounted below the die-attach pad 612 with an adhesive 614, such as a die-attach adhesive. The encapsulation 618, such as an epoxy molding compound, may be over the integrated circuit die 610 and a first lead 616. The shield 602 is over the encapsulation 618.

The shield 602 can be formed from a number of different conductive materials. For example, the shield 602 can be formed from metal, conductive resin, foil, conductive film, or a conductive epoxy. The shield 602 may connect to a ground reference or a reference at other voltage levels to provide electromagnetic interference (EMI) shielding for the integrated circuit package system 600.

A portion of the first lead 616 is half-etched down from a top side 620 to form a lower portion 622 such that the encapsulation 618 can isolate the lower portion 622 of the first lead 616 and the shield 602. The encapsulation 618 can prevent electrical shorting between the shield 602 and the first lead 616.

The integrated circuit die 610 has a non-active side 624 and an active side 626, wherein the active side 626 includes active circuitry fabricated thereon. In this example, the non-active side 624 preferably faces the die-attach pad 612. The encapsulation 618 may expose the die-attach pad 612. The shield 602 may couple to the exposed portion of the die-attach pad 612. With the shield 602 connected to a ground reference, the die-attach pad 612 may also function as part of the EMI shield.

Internal interconnects 628, such as bond wires or ribbon bond wires, may connect the active side 626 and a non-horizontal interior portion of the first lead 616, and between the die-attach pad 612 and a non-horizontal interior portion of the first lead 616. For illustrative purposes, both the integrated circuit die 610 and the die-attach pad 612 are connected to the same location of the first lead 616. Although, it is understood that that the die-attach pad 612 and the integrated circuit die 610 may be connected to different locations of the first lead 616. For example, the die-attach pad 612 may connect to a ground reference through the first lead 616 at predetermined locations.

The integrated circuit package system 600 may have structural similarities to the integrated circuit package system 100 of FIG. 2. For example, the integrated circuit package system 600 may also include the second lead 432 of FIG. 4 or the corner lead 330 of FIG. 3 such that the shield 602 may be coupled to one or both for ground or reference connection.

Figure 7:
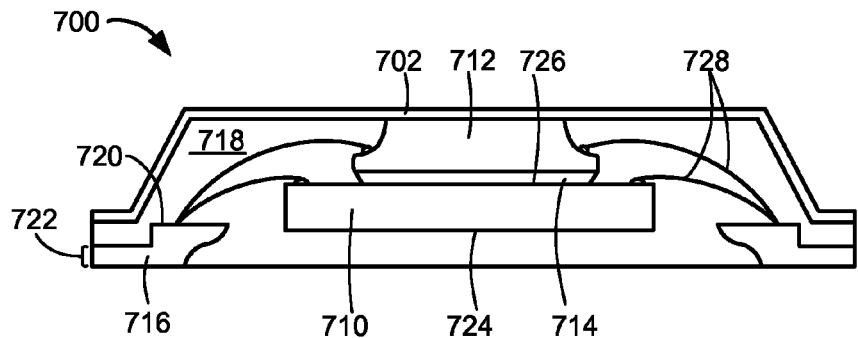
FIG. 7 is a cross-sectional view of an integrated circuit package system exemplified by the top view of FIG. 1 along line 2-2 of FIG. 1 in a third embodiment of the present invention.

Referring now to FIG. 7, therein is shown a cross-sectional view of an integrated circuit package system 700 exemplified by the top view of FIG. 1 along line 2-2 of FIG. 1 in a second embodiment of the present invention. The cross-sectional view depicts a shield 702 over a die-attach pad 712 and an encapsulation 718. The cross-sectional view also depicts an integrated circuit die 710 mounted below the die-attach pad 712 with an adhesive 714, such as a die-attach adhesive. The encapsulation 718, such as an epoxy molding compound, may be over the integrated circuit die 710 and a first lead 716. The shield 702 is over the encapsulation 718.

The shield 702 can be formed from a number of different conductive materials. For example, the shield 702 can be formed from metal, conductive resin, foil or conductive film. The shield 702 may connect to a ground reference or a reference at other voltage levels to provide electromagnetic interference (EMI) shielding for the integrated circuit package system 700.

A portion of the first lead 716 is half-etched down from a top side 720 to form a lower portion 722 such that the encapsulation 718 can isolate the lower portion 722 of the first lead 716 and the shield 702. The encapsulation 718 can prevent electrical shorting between the shield 702 and the first lead 716.

The integrated circuit die 710 has a non-active side 724 and an active side 726, wherein the active side 726 includes active circuitry fabricated thereon. In this example, the active side 726 preferably faces the die-attach pad 712. The encapsulation 718 may expose the die-attach pad 712. The shield 702 may couple to the exposed portion of the die-attach pad 712. With the shield 702 connected to a ground reference, the die-attach pad 712 may also function as part of the EMI shield.

Internal interconnects 728, such as bond wires or ribbon bond wires, may connect the active side 726 and the top side 720 of the first lead 716, and between a non-horizontal interior portion of the die-attach pad 712 and the top side 720 of the first lead 716. For illustrative purposes, both the integrated circuit die 710 and the die-attach pad 712 are connected to the same location of the first lead 716. Although, it is understood that that the die-attach pad 712 and the integrated circuit die 710 may be connected to different locations of the first lead 716. For example, the die-attach pad 712 may connect to a ground reference through the first lead 716 at predetermined locations.

The integrated circuit package system 700 may have structural similarities to the integrated circuit package system 100 of FIG. 2. For example, the integrated circuit package system 700 may also include the second lead 432 of FIG. 4 or the corner lead 330 of FIG. 3 such that the shield 702 may be coupled to one or both for ground or reference connection.

Figure 8:
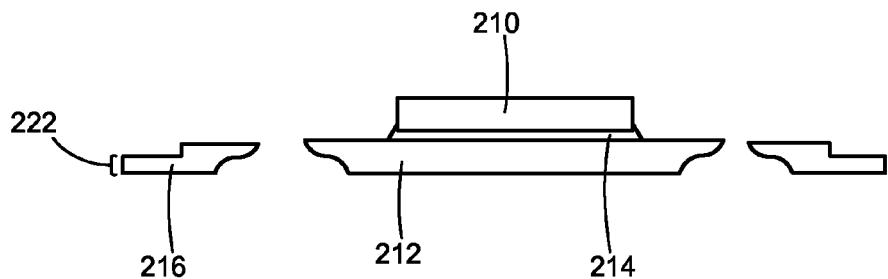
FIG. 8 is the structure of FIG. 2 in a step for attaching the integrated circuit die.

Referring now to FIG. 8, therein is shown the structure of FIG. 2 in a step for attaching the integrated circuit die 210. The cross-sectional view depicts the integrated circuit die 210 mounted over the die-attach pad 212 with the adhesive 214. The first lead 216 having the lower portion 222 is shown adjacent to the die-attach pad 212. The die-attach pad 212 is optional.

Figure 9:
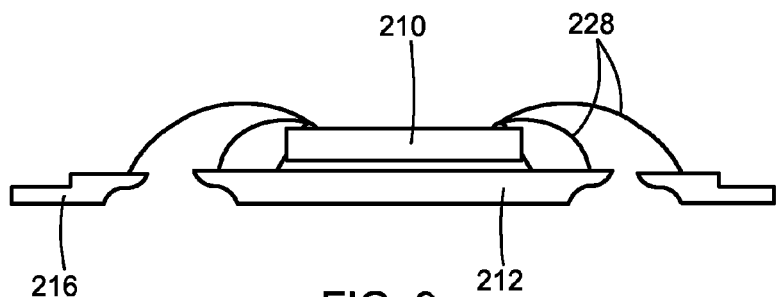
FIG. 9 is the structure of FIG. 8 in a step for connecting the internal interconnects.

Referring now to FIG. 9, therein is shown the structure of FIG. 8 in a step for connecting the internal interconnects 228. The cross-sectional view depicts the integrated circuit die 210 mounted over the die-attach pad 212. The internal interconnects 228 may connect between the integrated circuit die 210 and the die-attach pad 212, and between the integrated circuit die 210 and the first lead 216.

Figure 10:
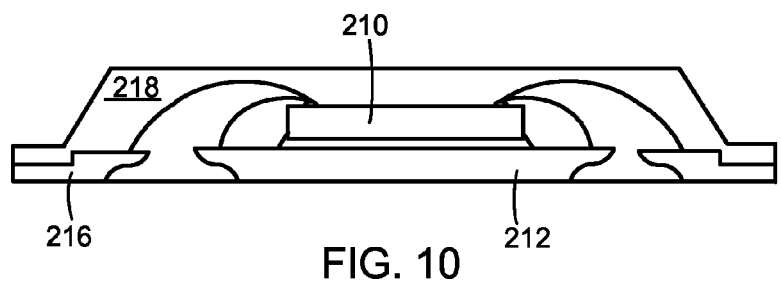
FIG. 10 is the structure of FIG. 9 in a step for forming the package encapsulation.

Referring now to FIG. 10, therein is shown the structure of FIG. 9 in a step for forming the encapsulation 218. The cross-sectional view depicts the integrated circuit die 210 mounted over the die-attach pad 212 and connected to the first lead 216. The encapsulation 218 may be formed in a number of methods. For example, the structure of FIG. 9 may be placed between mold chases (not shown) and may undergo a molding process to form the encapsulation 218.

Figure 11:
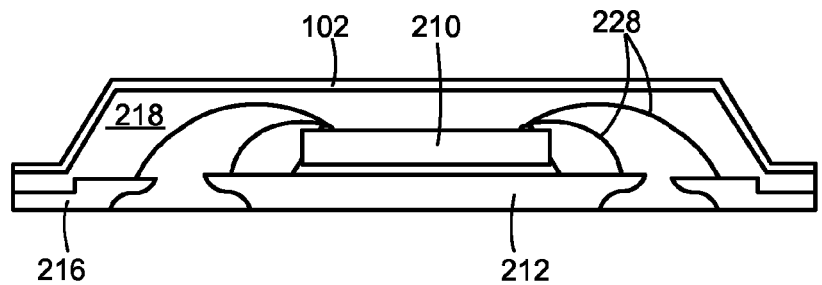
FIG. 11 is the structure of FIG. 10 in a step for forming the shield.

Referring now to FIG. 11, therein is shown the structure of FIG. 10 in a step for forming the shield 102. The cross-sectional view depicts the encapsulation 218 formed over the integrated circuit die 210, the die-attach pad 212, the internal interconnects 228, and the first lead 216. The shield 102 is conformally formed over the top surface of the encapsulation 218. The shield 102 can be formed by a number of different methods. For example, the shield 102 can be formed or coated over the encapsulation 218 by coating, plating, sputtering, spraying, painting, rolling and laminating.

Figure 12:
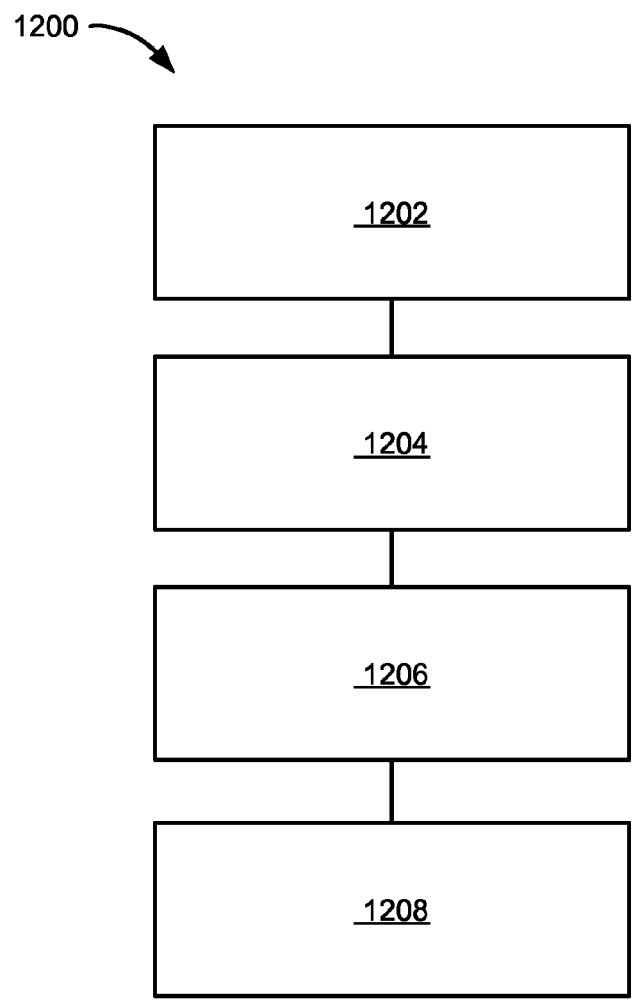
FIG. 12 is a flow chart of an integrated circuit package system for manufacturing of the integrated circuit package system in an embodiment of the present invention.

Referring now to FIG. 12, therein is shown a flow chart of an integrated circuit package system 1200 for manufacturing of the integrated circuit package system 100 in an embodiment of the present invention. The system 1200 includes forming a first lead and a second lead in a block 1202; connecting an integrated circuit die with the first lead in a block 1204; forming an encapsulation over the integrated circuit die, the first lead, and the second lead with a portion of a top side of the second lead exposed in a block 1206; and forming a shield over the encapsulation, the first lead, and the second lead with the shield not in contact with the first lead in a block 1208.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacturing an integrated circuit package system comprising:

forming a first lead;

forming a second lead, the second lead having an outer end and a top portion, the top portion adjacent to the first lead;

connecting an integrated circuit die to the first lead;

forming an encapsulation on the integrated circuit die, the first lead, and the second lead, the encapsulation having a planar sidewall; and forming a shield over the top surface of the encapsulation, the shield isolated from the first lead by the encapsulation, the shield being directly formed on the top portion of the second lead, and wherein the shield includes an outer edge facing away from the integrated circuit die, the outer edge of the shield being coplanar with the outer end of the second lead and the planar sidewall of the encapsulation.

2. The method as claimed in claim 1 wherein:

forming the first lead includes:

forming a stepped down portion of the first lead; and forming the shield includes:

forming the shield over the stepped down portion with the encapsulation in between.

3. The method as claimed in claim 1 wherein forming the shield over the second lead includes forming the shield on the second lead.

4. The method as claimed in claim 1 further comprising:

forming a corner lead; and wherein forming the shield includes:

forming the shield over the corner lead.

5. The method as claimed in claim 1 further comprising connecting the shield to a reference level.

6. A method of manufacturing an integrated circuit package system comprising:

forming a first lead;

forming a second lead, the second lead having an outer end and a top portion, the top portion adjacent to the first lead;

connecting an integrated circuit die to the first lead;

forming an encapsulation on the integrated circuit die, the first lead, and the second lead, the encapsulation having a planar sidewall;

forming a shield over top surface of the encapsulation, the shield isolated from the first lead by the encapsulation, the shield being directly formed on the top portion of the second lead, and wherein the shield includes an outer edge facing away from the integrated circuit die, the outer edge of the shield being coplanar with the outer end of the second lead and the planar sidewall of the encapsulation; and connecting the shield to a reference level coupled with the second lead.

7. The method as claimed in claim 6 wherein forming the shield includes forming the shield conformal to a top surface of the encapsulation.

8. The method as claimed in claim 6 further comprising:
forming a corner lead; and
wherein forming the shield includes:
forming the shield on the corner lead coupled to a ground reference.

9. The method as claimed in claim 6 wherein connecting the shield to the reference level coupled with the second lead includes connecting the shield on the second lead coupled to a ground reference.

10. The method as claimed in claim 6 wherein:
forming the first lead includes:
forming a die-attach pad having a corner lead extended therefrom;
forming the shield includes:
forming the shield on the corner lead; and
connecting the integrated circuit die includes:
connecting the integrated circuit die and the second lead.

11. An integrated circuit package system comprising:
a first lead;
a second lead, the second lead having an outer end and a top portion, the top portion adjacent to the first lead;
an integrated circuit die connected to the first lead;
an encapsulation on the integrated circuit die, the first lead, and the second lead, the encapsulation having a planar sidewall; and
a shield over the top surface of the encapsulation, the shield isolated from the first lead by the encapsulation, the shield being directly formed on the top portion of the second lead, and wherein the shield includes an outer edge facing away from the integrated circuit die, the outer edge of the shield being coplanar with the outer end of the second lead and the planar sidewall of the encapsulation.

12. The system as claimed in claim 11 wherein:
the first lead includes a stepped down portion of the first lead; and
the shield includes the shield over the stepped down portion with the encapsulation in between.

13. The system as claimed in claim 11 wherein the shield is on the second lead.

14. The system as claimed in claim 11 further comprising:
a corner lead; and
wherein the shield includes:
the shield over the corner lead.

15. The system as claimed in claim 11 further comprising the shield connected to a reference level.

16. The system as claimed in claim 11 wherein the shield connected with the second lead coupled to a reference level.

17. The system as claimed in claim 16 wherein the shield is conformal to a top surface of the encapsulation.

18. The system as claimed in claim 16 further comprising:
a corner lead; and
wherein the shield includes:
the shield on the corner lead coupled to a ground reference.

19. The system as claimed in claim 16 wherein the shield is on the second lead coupled to a ground reference.

20. The system as claimed in claim 16 further comprising:
a die-attach pad having a corner lead extended therefrom adjacent the first lead or the second lead; and
wherein:
the shield is on the corner lead; and
the integrated circuit die is connected with the second lead.

* * * * *